United States Patent
Franck (10) Patent No.: US 6,377,107 B1
(45) Date of Patent: Apr. 23, 2002

(54) FAST TURN-OFF CIRCUIT ARRANGEMENT

(75) Inventor: Felix Franck, Munich (DE)

(73) Assignee: Patent-Treuhand-Gesellschaft fur Elektrische Gluhlampen mpH, Munich (DE)

(*) Notice: Subject to any disclaimer, the term of this patent is extended or adjusted under 35 U.S.C. 154(b) by 0 days.

(21) Appl. No.: 09/614,432

(22) Filed: Jul. 12, 2000

(30) Foreign Application Priority Data

Jul. 20, 1999 (DE) .......................................... 199 33 161

(51) Int. Cl.[7] .............................................. H03K 17/04
(52) U.S. Cl. ........................ 327/374; 327/376; 327/377; 327/487; 315/224; 315/225; 315/209 R; 315/307; 315/363
(58) Field of Search ................................ 315/224, 225, 315/209 R, 246, 291, DIG. 2, DIG. 5, 307; 327/376, 478, 484, 374, 375, 377, 487, 482, 483, 489

(56) References Cited

U.S. PATENT DOCUMENTS

| | | | |
|---|---|---|---|
| 4,481,434 A | 11/1984 | Janutka | 307/570 |
| 5,073,745 A | * 12/1991 | Kakitani | 315/307 |
| 5,097,183 A | * 3/1992 | Vila-Masot et al. | 315/226 |
| 5,831,396 A | * 11/1998 | Rudolph | 315/307 |
| 5,834,964 A | 11/1998 | Scheraga | 327/376 |

FOREIGN PATENT DOCUMENTS

| | | |
|---|---|---|
| DE | 69014688 T2 | 9/1990 |
| DE | 4238913 A1 | 5/1994 |
| DE | 4436465 A1 | 4/1996 |
| DE | 19728295 A1 | 1/1999 |

\* cited by examiner

*Primary Examiner*—Don Wong
*Assistant Examiner*—Tuyet T. Vo
(74) *Attorney, Agent, or Firm*—Frishauf, Holtz, Goodman, Langer & Chick, P.C.

(57) ABSTRACT

A circuit arrangement having at least one electric main switch (T1) with a reference electrode (E), a control electrode (B), and a work electrode (C). A recovery diode (D1; D2) is connected antiparallel to the main flow direction of each main switch (T1). In order to speed up the switch-off process and in particular to reduce the attendant power loss, each main switch (T1) is assigned an electric auxiliary switch (T11; T22), whose work electrode is connected to the control electrode (B) of the associated main switch (T1) and whose reference electrode is connected to the reference electrode (E) of the associated main switch (T1). The capacitor (C11) is disposed between the control electrode of the auxiliary switch (T11; T22) and the work electrode (C) of the associated main switch (T1). A discharge unit (D11) is disposed between the control electrode and the reference electrode of the auxiliary switch in such a way that the capacitor (C11) can be discharged during the transition of the main switch (T1) from the OFF state to the ON state.

27 Claims, 12 Drawing Sheets

FAST TURN-OFF CIRCUIT ARRANGEMENT

FIELD OF THE INVENTION

The present invention relates to a circuit arrangement, having at least one electric main switch with a reference electrode, a control electrode and a work electrode, and a free-wheeling diode which is connected antiparallel to the main flow direction of each main switch.

In electronics in general but especially in power electronics, there is a need to be able to process the highest possible power levels while occupying the least possible space. This is associated with the demand for keeping incident power losses minimal, since a power loss is converted into heat and as a result, (larger) cooling bodies and hence larger housing dimensions are needed. In externally-controlled and self-controlled transistor inverters, for instance, the incident power loss is less, the higher the speed and resolution with which the switching events of the transistors proceed. Particularly when bipolar switching transistors are used, it is especially difficult to achieve brief switching events. Although the invention is applicable to circuits with field effect transistors, the problems and their solution according to the invention will be described below taking bipolar transistors as an example.

BACKGROUND OF THE INVENTION

Figure 1A:
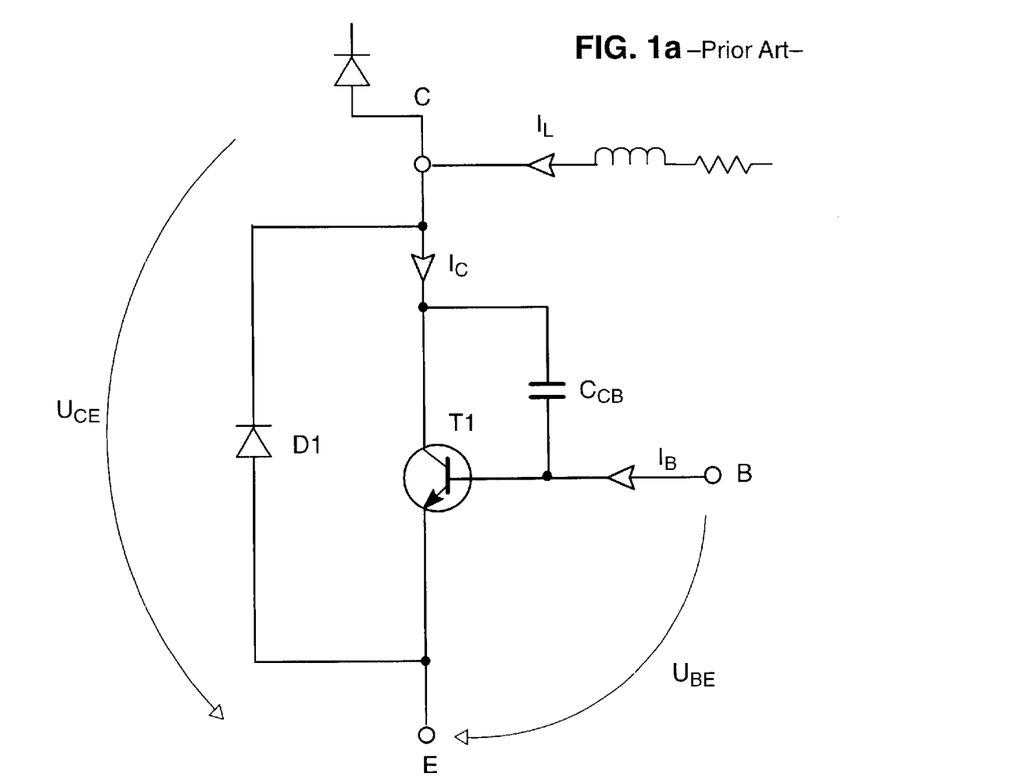
FIG. 1a shows the wiring of a power transistor with a free-wheeling diode, of the kind known from the prior art, for defining some variables as an initial situation.
Figure 1B:
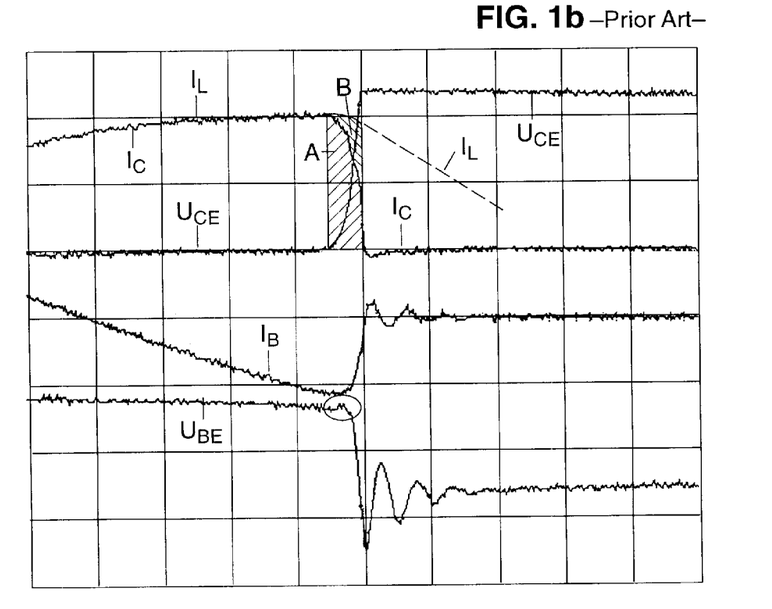

The problems the invention seeks to solve will first be presented with reference to FIG. 1a. FIG. 1a shows the standard situation, known from the prior art, of a power switching transistor T1, in this case a bipolar transistor, to which a free-wheeling diode D1 is connected anti-parallel. The three externally accessible terminals of the transistor are marked C for collector (work electrode), B for base (control electrode), and E for emitter (reference electrode). Let $U_{CE}$ be the voltage that drops between the collector and the emitter, $U_{BE}$ be the voltage that drops between the base and the emitter, $I_C$ be the current flowing into the collector, and $I_B$ be the current flowing into the base. Between the collector and the base, there is a parasitic capacitance, the so-called Miller capacitance $C_{CB}$. This is correspondingly true for field effect transistors as well. The definitive power loss during a switching event is determined by the product $I_C \cdot U_{CE}$. In FIG. 1b, the course of not only these two variables but also the course of the base-to-emitter voltage $U_{BE}$ and of the base current $I_B$ are plotted over time. A relatively loss-free and thus desirable switching event is characterized in that as soon as $U_{CE}$ begins to rise, the collector current $I_C$ drops sharply. The course over time of the variables $I_C$ and $U_{CE}$, shown for the circuit in FIGS. 1a and 1b, does not meet this condition, for the following reasons: First, for the discussion below it will be assumed that the emitter of the transistor T1 is connected to ground. Thus if the voltage at the collector increases, that is, if $U_{CE}$ rises, then because of the charge current through the Miller capacitance $C_{CB}$ and because of the voltage-related "softness" of the base terminal, the base voltage $U_{BE}$ is "slaved"; that is, $U_{BE}$ also increases (see the circle in FIG. 1b) instead of decreasing. Since the base triggering has a so-called current source characteristic, the current that charges the Miller capacitance $C_{CB}$ acts with negative feedback on the base electrode of the transistor T1. The switch-off event is slowed down sharply as a result: While $U_{CE}$ is already rising, $I_C$ is still present in virtually its full intensity. This also becomes clear from the convex course of the curve of the current $I_C$ during the switch-off event. The shaded area marked A corresponds to the charge that still flows through the transistor even though the transistor has already been "switched off". The course of the current $I_L$ through an ohmic-inductive load, which is connected to the work electrode of the main switch, is indicated by dashed lines. The charge for the charge reversal event, marked by the area B, is accordingly furnished by transistor capacitors (not shown). The ratio of area A to area B, that is, of the switch-off current to the charge reversal current, can be considered a measure for the losses of the switchover event. The lower the ratio of A to B is, the less are the losses that occur in a switchover event.

Previous ways of speeding up such switch-off events provided on the one hand connecting a resistor, on an order of magnitude of less than 100Ω, parallel to the base-to-emitter path, and on the other connecting a series circuit comprising a capacitor with a capacitance of $\leq 10$ nF and a be resistance of $\leq 100Ω$ parallel to the base-to-emitter path. The results of these versions are unsatisfactory, however, because the switch-off losses are still great, as they were before.

OBJECT AND SUMMARY OF THE INVENTION

The object of the present invention is therefore to refine a circuit arrangement of the type defined at the outset such that the losses occurring in a switch-off event of the main switch are as slight as possible.

For attaining this object, the invention provides that each main switch is assigned an electric auxiliary switch, whose work electrode is connected to the control electrode of the associated main switch and whose reference electrode is connected to the reference electrode of the associated main switch, and at least one capacitor is disposed between the control electrode of the auxiliary switch and the work electrode of the associated main switch, and a discharge unit is disposed between the control electrode and the reference electrode of the auxiliary switch in such a way that the at least one capacitor can be discharged during the transition of the main switch from the OFF state to the ON state.

The embodiment according to the invention makes use of the recognition that a voltage increase at the work electrode of the main switch can be transmitted to the control electrode of the auxiliary switch via a capacitor. Given a suitable choice of the auxiliary switch, the charging event of the capacitor trips the transition of the switch to the ON state. Since the work electrode of the auxiliary switch is connected to the control electrode of the main switch, active charge carriers are thereby drawn from the control electrode of the main switch. The influence of the Miller capacitance $C_{CB}$, which slows down the switch-off event of the main switch, can be counteracted as a result. This leads to a marked speeding up of the switch-off event and thus to markedly lesser losses than in the versions of the prior art. The discharge unit serves to discharge the capacitor between the switch-off events, so that it is again available for the ensuing switch-off event or in other words can be charged again.

In its simplest embodiment, the discharge unit comprises a single resistor. In an alternative embodiment, the discharge unit can include a discharge diode, preferably in the form of a Schottky diode, Zener diode or p-n diode; at least one resistor can be connected in series with and/or parallel to the discharge diode. The discharge unit can have a switch-off input terminal, by way of which a signal that switches the auxiliary switch to the ON state can be applied. The connection of the switch-off input terminal to the control electrode of the auxiliary switch preferably includes a shut-down diode, which with respect to the control electrode of the auxiliary switch is oriented like the discharge diode. The switch-off diode can be embodied as a p-n or Schottky diode.

The discharge unit can have a sense output terminal, which is connected to the control electrode of the auxiliary switch such that the switching status of the main switch and/or the auxiliary switch can be interrogated via the sense output terminal. At least one capacitor for shifting the potential can be disposed between the sense output terminal and the control electrode of the auxiliary switch.

The circuit arrangement of the invention can also have an antisaturation unit, which is disposed between the work electrode and the control electrode of the auxiliary switch and which prevents saturation of the control electrode of the auxiliary switch. In its simplest embodiment, the antisaturation unit can be embodied by a single resistor, which is disposed such that in the event of saturation of the control electrode of the auxiliary switch, charge carriers can flow away to the work electrode of the auxiliary switch. In an alternative, especially preferred embodiment, the antisaturation unit can have an antisaturation diode, which is disposed such that it performs the same purpose. The antisaturation diode can be a p-n or Schottky diode; at least one resistor can be connected in series with and/or parallel to the antisaturation diode.

A main switch can be a bipolar transistor, but it can also be realized with the associated free-wheeling diode by a MOSFET. As the auxiliary switch, the following can be considered: a bipolar transistor, a bipolar transistor with a series diode in the collector, a MOSFET, or a MOSFET with a series diode in the drain, and if a series diode is used, its orientation is made such that a current flow in the main flow direction of the associated auxiliary switch is made possible. This series diode is preferably in the form of a Schottky diode.

The invention also includes a bridge circuit having at least one first and one second circuit arrangement, in which a bridge is formed by connecting the reference electrode of the main switch of the second ("upper") circuit arrangement to the work electrode of the main switch of the first ("lower") circuit arrangement, optionally with the interposition of additional components. A bridge circuit of this kind can be part of a free-running oscillator circuit for operating a load, which furthermore has a switching control device for feedback of the load current to the control electrodes of the main switches of the first and second circuit arrangements, and the control electrode of each main switch is connected by a respective terminal line to the switching control device, and the two terminal lines are connected in turn to one another via at least one so-called base bridge capacitor. The switching control device can be a control transformer. The base bridge capacitor can be connected directly to the control electrode of each main switch and/or directly to the output of the switching control device oriented toward the control electrode of the applicable main switch.

Other advantageous refinements can be learned from the dependent claims.

Exemplary embodiments will be described in further detail below in conjunction with the accompanying drawings.

BRIEF DESCRIPTION OF THE DRAWINGS

FIG. 1b shows the courses over time of the collector current $I_C$, the collector-to-emitter voltage $U_{CE}$, the base-to-emitter voltage $U_{BE}$, and the base current $I_B$ for a switch-off event of the power transistor of FIG. 1a;

FIG. 2b shows the courses over time of the collector current $I_C$, the collector-to-emitter voltage $U_{CE}$, the base-to-emitter voltage $U_{BE}$, and the base current $I_B$ for a switch-off event of the circuit arrangement of FIG. 2a;

FIG. 5 shows an example of a circuit with two circuit arrangements of the invention, used by way of example in an inverter;

DETAILED DESCRIPTION

Figure 2A:
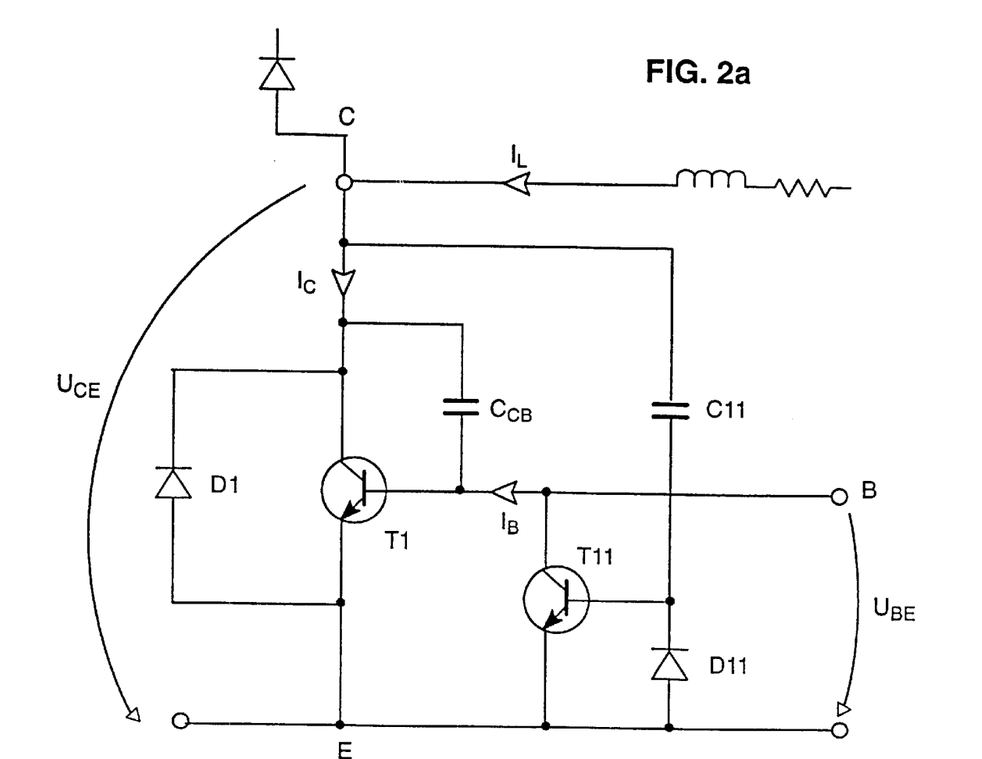
FIG. 2a shows a very simple embodiment of a circuit arrangement according to the invention.
Figure 2B:
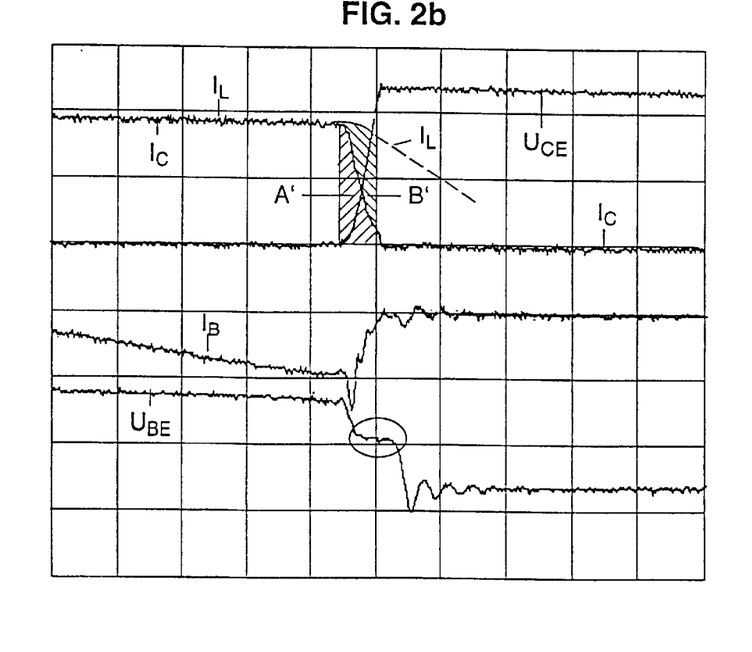
Figure 2C:
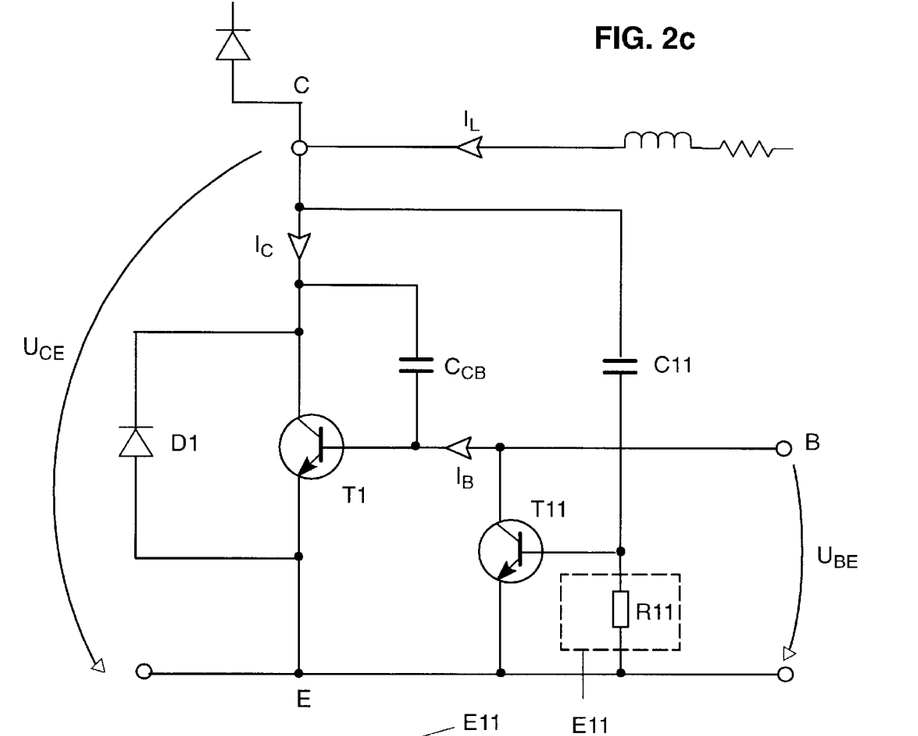
FIG. 2c shows a variation of the embodiment depicted in FIG. 2a with one type of discharge unit.
Figure 2D:
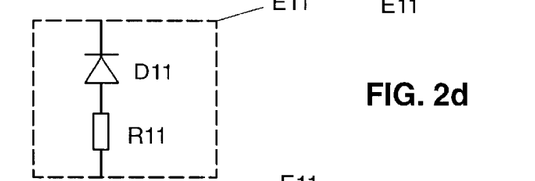
FIGS. 2d to 2f are variations of the discharge unit shown in FIG. 2c.
Figure 2E:
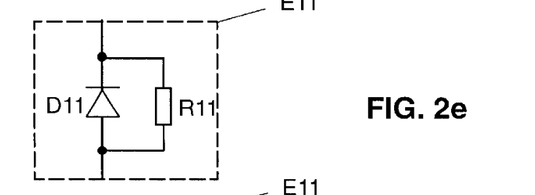
Figure 2F:
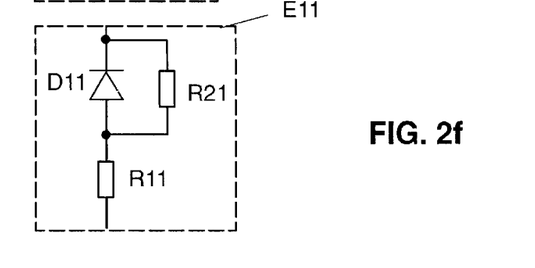

FIG. 2a shows the circuit arrangement of FIG. 1a, augmented according to the present invention; for the discussion below, with reference to transistor T1, let its collector be its work electrode, its base be its control electrode and its emitter be its reference electrode, and with reference to transistor T11, let its collector be its work electrode, its base be its control electrode and its emitter be its reference electrode; as its auxiliary switch, the transistor T1 is assigned the transistor T11, whose work electrode is connected to the control electrode of transistor T1. The emitter of transistor T11 is connected to the reference electrode of transistor T1. The control electrode of transistor T11 is connected on the one hand to the work electrode of transistor T1 via a capacitor C11, and on the other to the reference electrodes of both transistors via a discharge diode D11.

The function of the circuit arrangement of FIG. 2a: as soon as $U_{CE}$ begins to rise, the base of the auxiliary transistor T11 experiences the flow of current that charges the positive feedback capacitor C11. This turns on the auxiliary transistor T11, thus connecting the base of the main transistor T1 to the emitter of the auxiliary transistor T11 with low resistance. As a result, charge carriers can flow out of the collector-to-base transition of the main transistor T1, via the auxiliary transistor T11.

With reference to FIG. 2, it is clear that this wiring provision leads to a markedly lower-loss switch-off event than the circuit arrangement of FIG. 1a: The outflow of charge carriers from the collector-to-base transition of T1 can be documented in FIG. 2b at the negative peak in the course of the base current $I_B$, precisely at the point where $U_{CE}$ begins to rise. At the same instant, the base-to-emitter voltage becomes nearly 0 volts (circle in FIG. 2b). The two provisions together, that is, the outflow of charge carriers from the base of the main transistor T1 and clamping of the base-to-emitter voltage $U_{BE}$ of the main transistor T1 near 0 volts, leads to a marked acceleration of the switch-off event. Compared to the switch-off event of FIG. 1b, the curve course of the collector current $I_C$ is now concave. The current $I_C$ has already reverted to acceptable values, as long as the collector-to-emitter voltage $U_{CE}$ is still low. The ratio of the area A' to the area B' has become substantially smaller, which is an indicator of markedly lower losses during the switch-off event.

Figure 3:
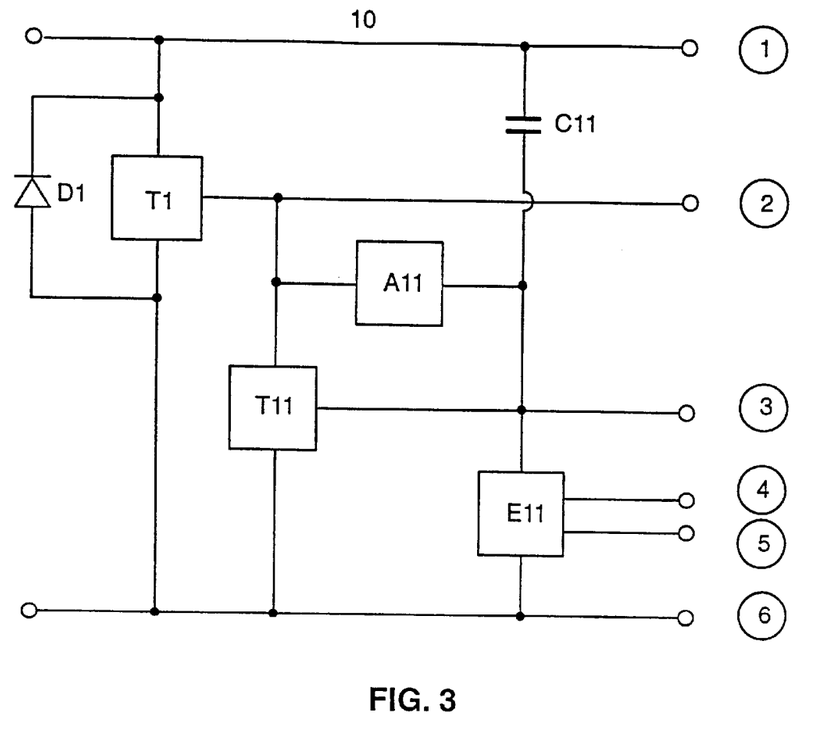
FIG. 3 shows a basic circuit diagram for circuit arrangements according to the invention.

FIG. 3 shows a basic circuit diagram of a circuit arrangement 10 of the invention. Of the terminals shown on the right in the drawing, terminal 1 designates the work electrode of the main switch T1; terminal 2 designates the control electrode of the main switch T1 and the work electrode of the auxiliary switch T11; terminal 3 designates the control electrode of the auxiliary switch T11; terminal 4 designates a shut-down input terminal of the discharge unit E11; terminal 5 designates a sense output terminal of the discharge unit E11; and terminal 6 designates the reference electrode for both the main switch T1 and the auxiliary switch T11. A free-wheeling diode D1 is connected antiparallel to the main switch T1. The positive feedback capacitor C11 is, as already mentioned, disposed between the work electrode of the main switch T1 and the control electrode of the auxiliary switch T11. The discharge unit E11 is disposed between the control electrode of the auxiliary switch T11 and the reference electrode of both switches. An antisaturation circuit A11, which is described in further detail below, can be provided between the control electrode of the main switch or the work electrode of the auxiliary switch and the control electrode of the auxiliary switch.

The main switch T1 can be embodied as a bipolar transistor; the combination of a main switch T1 and a recovery diode D1 can also be embodied by a MOSFET, in which the body diode of the MOSFET takes on the function of the free-wheeling diode D1.

The auxiliary switch T11 can be a bipolar transistor, a bipolar transistor with a series diode in the collector, a MOSFET, or a MOSFET with a series diode in the drain, and if a series diode is used, its orientation is made such that a current flow in the main flow direction of the associated auxiliary switch T11 is made possible. This series diode of the auxiliary switch T11 can be a p-n diode or preferably a Schottky diode. A simple embodiment of the discharge unit E11 has already been presented in conjunction with FIG. 2a. It can be in the form of a Schottky diode, Zener diode, or p-n diode. Its function is to enable a discharge of the capacitor C11 before the next time the main switch T1 is turned off.

Figure 4:
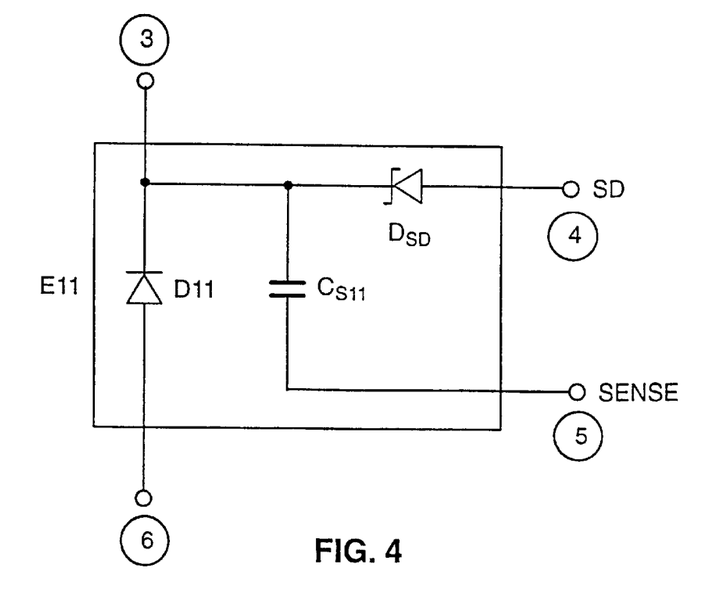
FIG. 4 shows an example of a circuit for the discharge unit.

FIG. 4 shows a further embodiment of the discharge unit E11. In this embodiment, a shut-down input terminal SD is connected via a diode $D_{SD}$ to the output of the discharge unit that is to be connected to the control electrode of the auxiliary switch T11. The switch-off diode $D_{SD}$ can be embodied as a p-n or Schottky diode. Via the switch-off input SD, the auxiliary switch T11 can be turned on from outside. As a result, the triggering of the main switch T1 is short-circuited. This enables the use of the switch-off input for safety shutoff, for instance if a component of this circuit becomes saturated or the circuit becomes too hot. The diode $D_{SD}$ prevents the positive feedback function of the positive feedback capacitor C11 from being attenuated by the shut-off input terminal SD, as would be the case if charge carriers did not, as intended, flow out to the control electrode of the auxiliary switch T11 but instead flowed out of the shut-off input terminal.

The discharge unit E11 of FIG. 4 also has a sense output terminal, with which the status of the discharge unit and thus the switching status of the main switch and/or the auxiliary switch can be interrogated. A capacitor $C_{S11}$ can be provided, in order to shift the potential of the sense output terminal to the desired level. The sense output terminal can advantageously be employed especially in soft switching and in externally controlled half bridges.

Figure 5A:
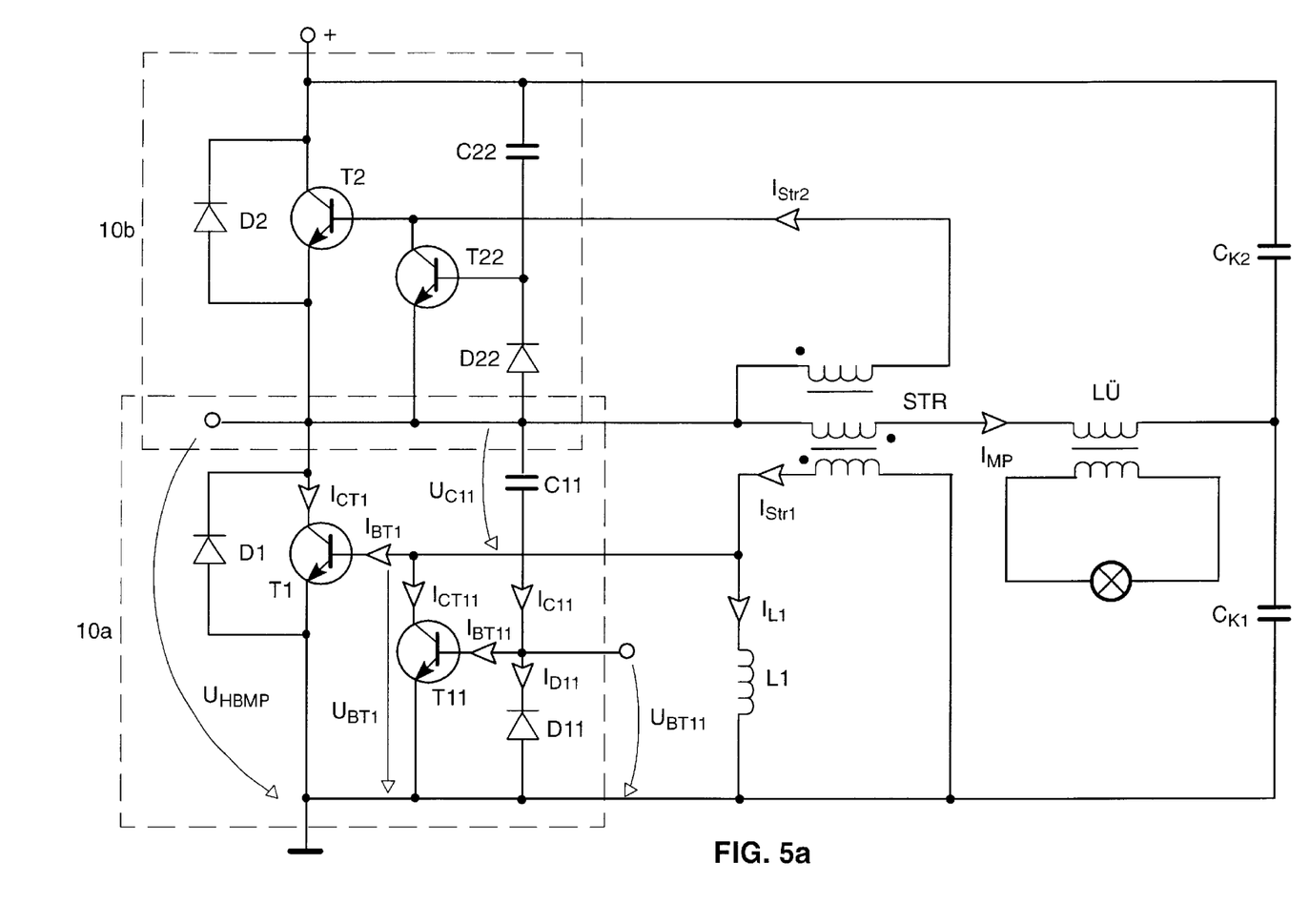
FIGS. 5a to 5c are different embodiments of the circuit shown in FIG. 5.
Figure 5B:
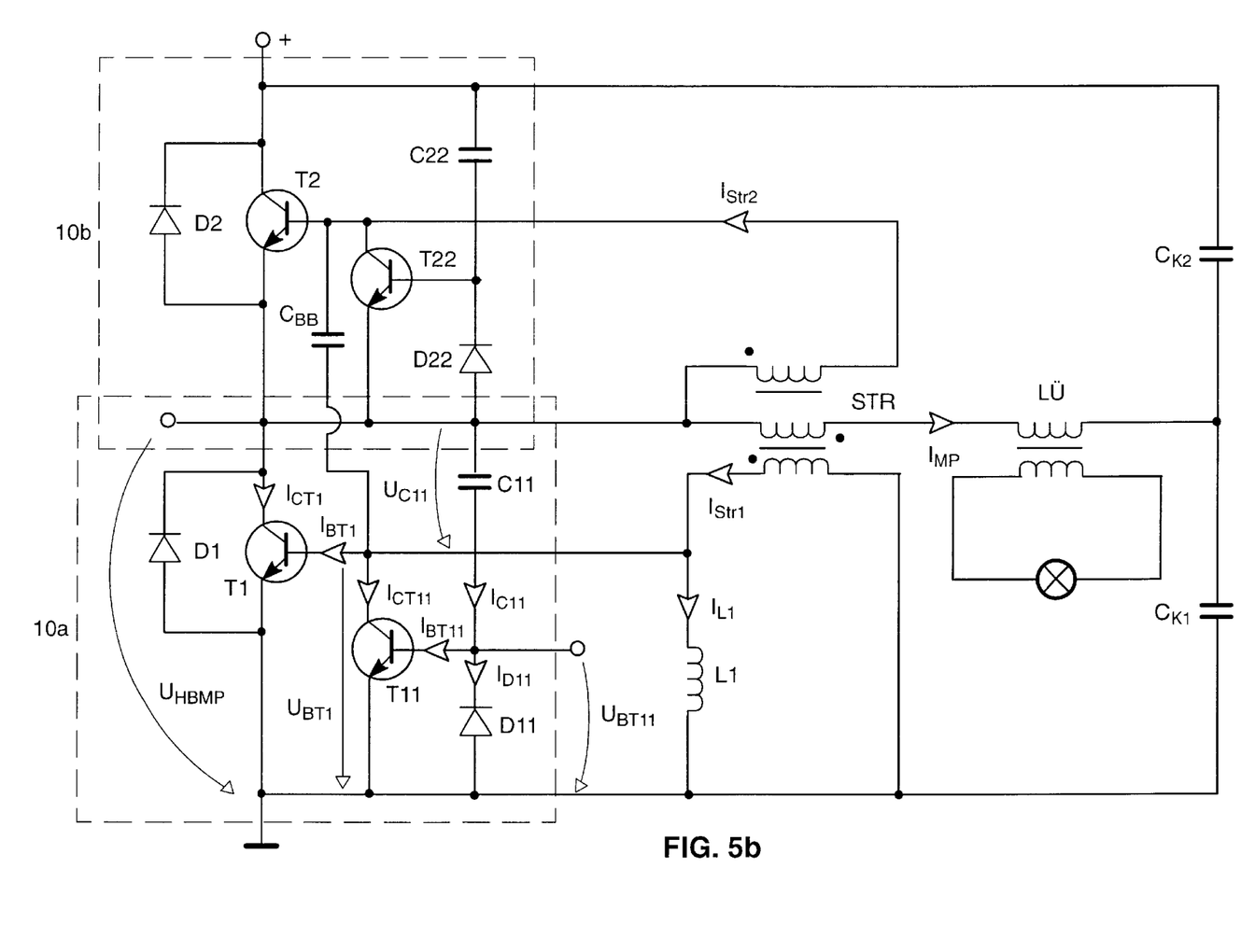
Figure 5C:
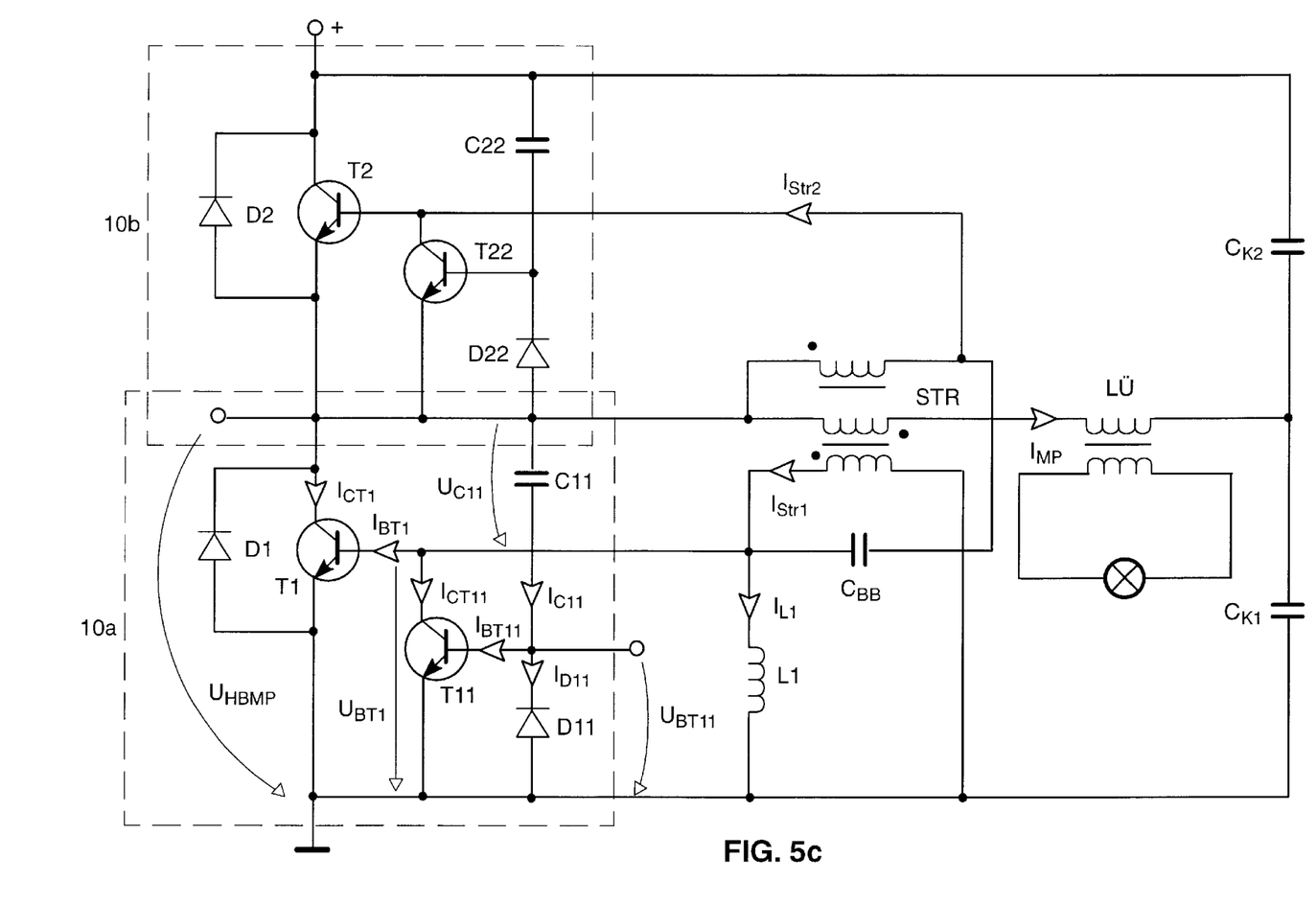

The circuit arrangement of the invention can be employed in many kinds of circuits, such as step-down converters, step-up converters, buck-boost converters, power factor correction circuits, Ćuk converters, etc., including especially operating equipment for electric lamps. As an example, FIG. 5 shows the use of two circuit arrangements of the invention in a self-controlled or in other words self-oscillating inverter for operating a low-voltage halogen incandescent lamp. The inverter includes a first and a second circuit arrangement 10a and 10b according to the invention. Each of these circuit arrangements includes one main switch T1, T2, one auxiliary switch T11, T22, one free-wheeling diode D1, D2, one discharge diode D11, D22, and one positive feedback capacitor C11, C22. A so-called base bridge capacitor $C_{BB}$ (optional) is connected between the control electrodes of the two main switches T1, T2, and it serves as it were to "draw away" the possibly prematurely ensuing current for opening the base or turning on the transistor. Details about the base bridge capacitor can be learned from German Patent Disclosure DE 197 28 295 A1 (whose inventor is the same as that of the present invention), and this disclosure is incorporated herein by reference. The two auxiliary transistors T11 and T22 have the further advantage that in principle they cancel out the slowing effect of the base bridge capacitor on the switch-off process. For triggering the two main switches, a control transformer STR is used, through whose primary winding the current $I_{MP}$ flows and whose secondary windings are connected to the control inputs of the two main switches T1 and T2. The load is embodied here by a lamp that is coupled by a transformer; the winding of the transformer through which the current $I_{MP}$ flows is connected on the one hand to the primary winding of the control transformer STR and on the other to coupling capacitors $C_{K1}$ and $C_{K2}$. The coupling capacitor $C_{K2}$ is connected to the work electrode of the transistor T2, and the coupling capacitor $C_{K1}$ is coupled to the reference electrode of the transistor T1. The function of the rod core choke L is of no significance to understanding the present invention; details of it can be found in German Patent Disclosure DE 44 36 465 A1.

Figure 6:
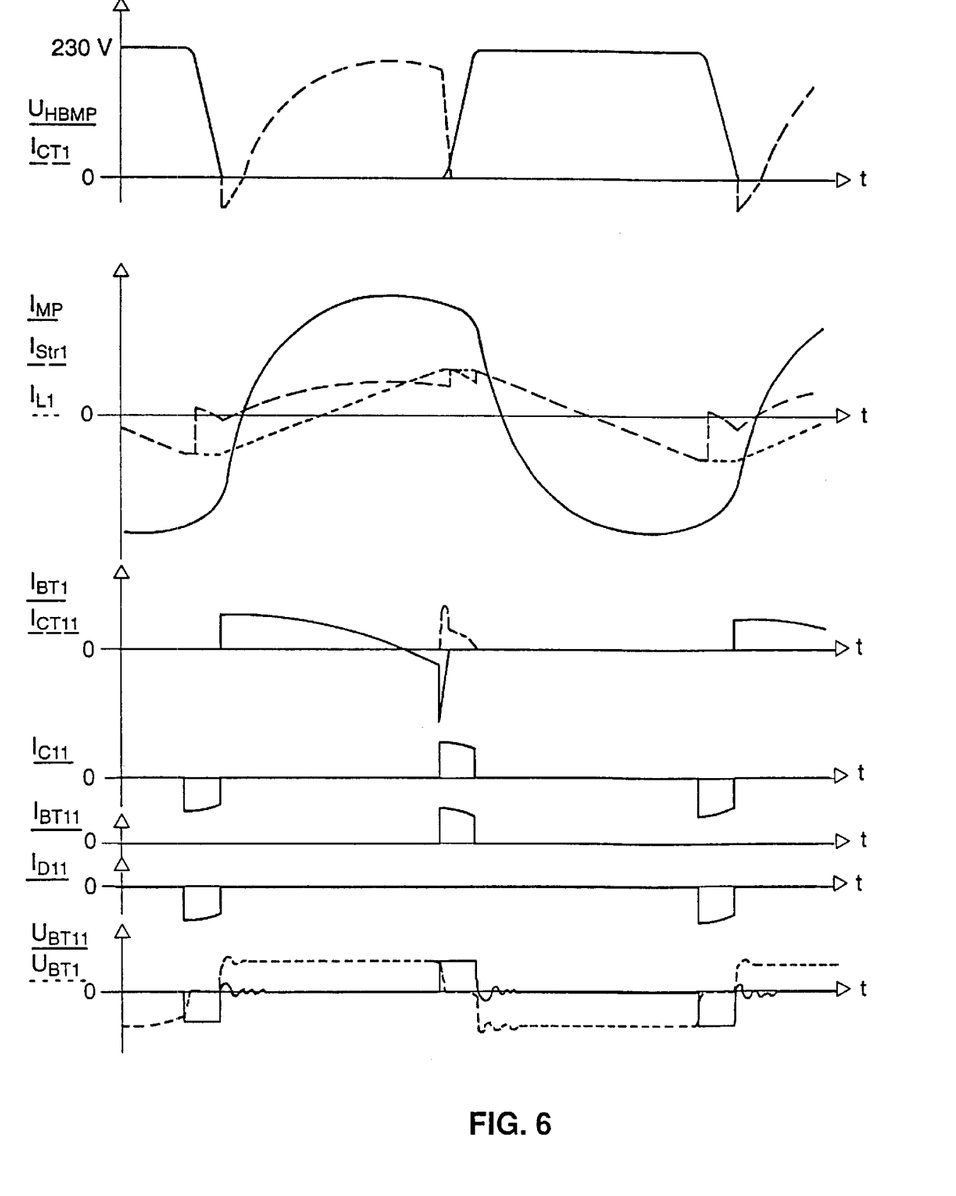
FIG. 6 shows the course over time of various variables of the exemplary circuit of FIG. 5.
Figure 7A:
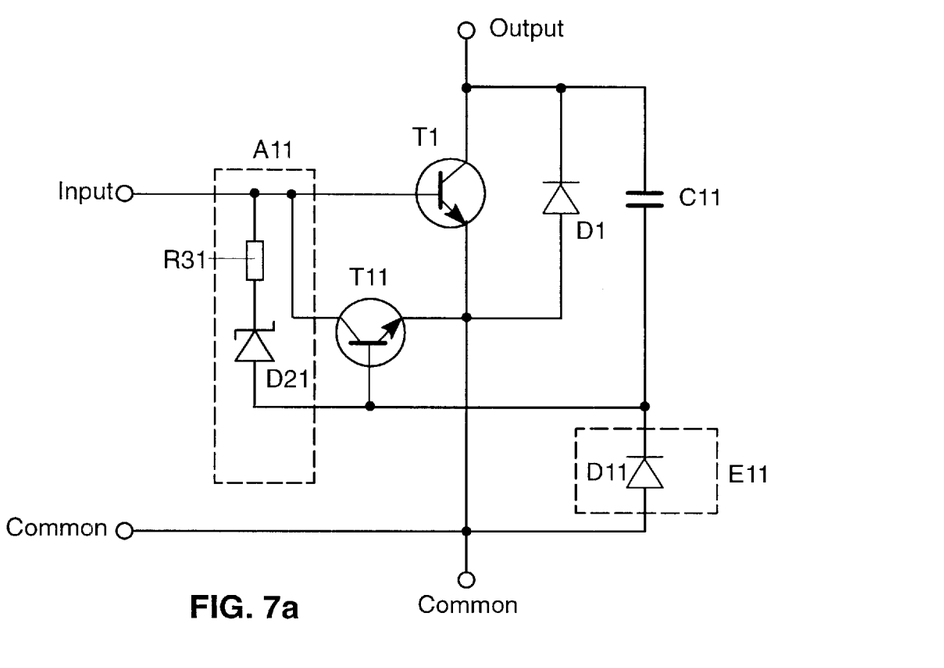
FIGS. 7a to 7e are different embodiments of the circuit shown in FIG. 3.
Figure 7B:
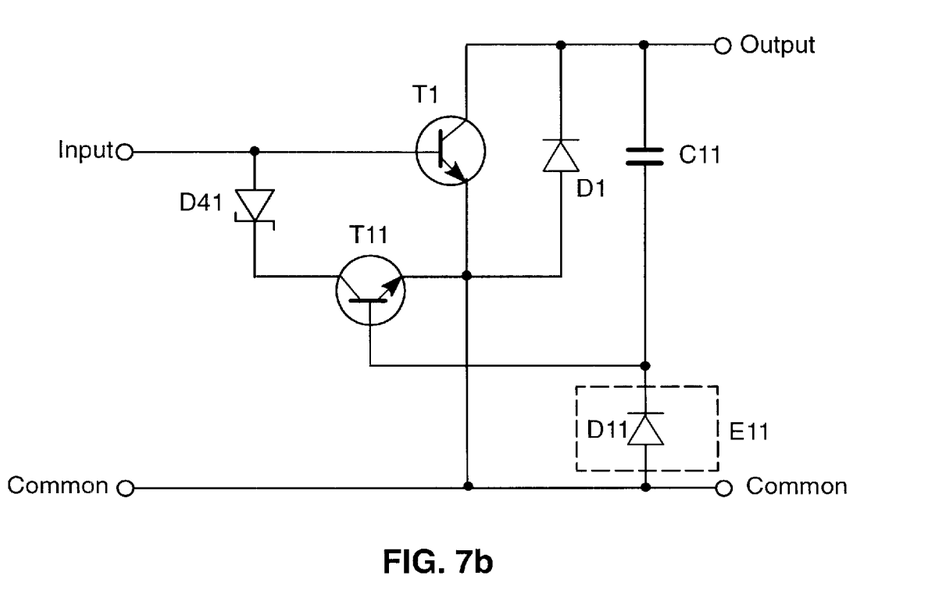
Figure 7C:
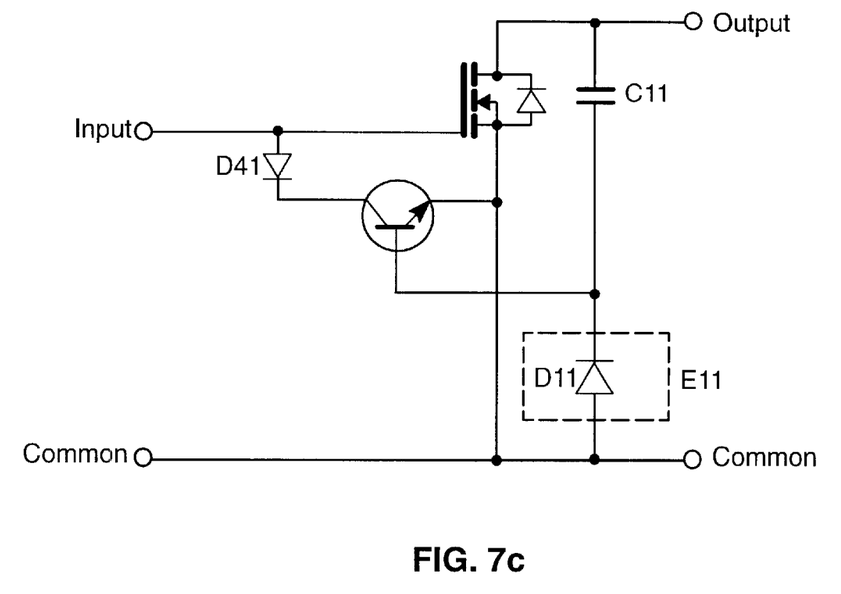
Figure 7D:
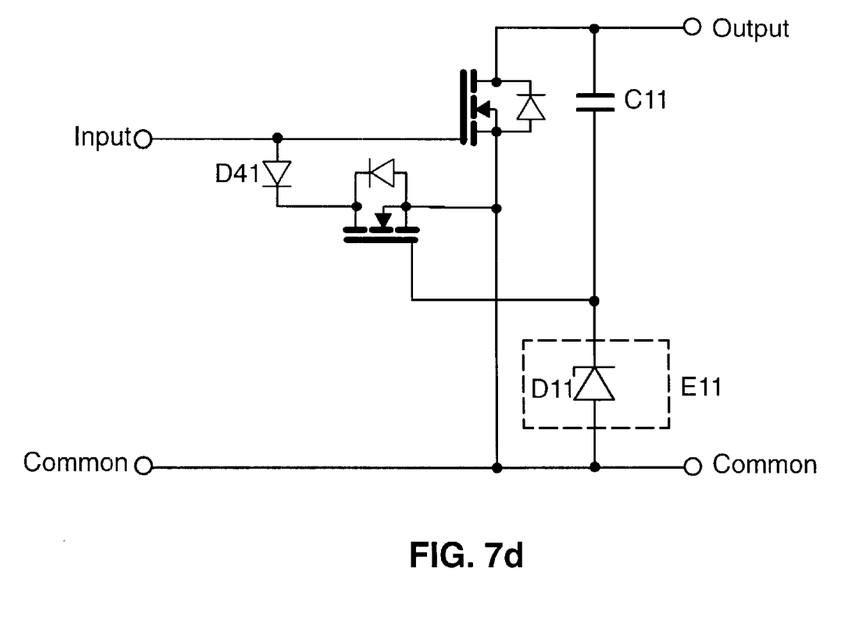
Figure 7E:
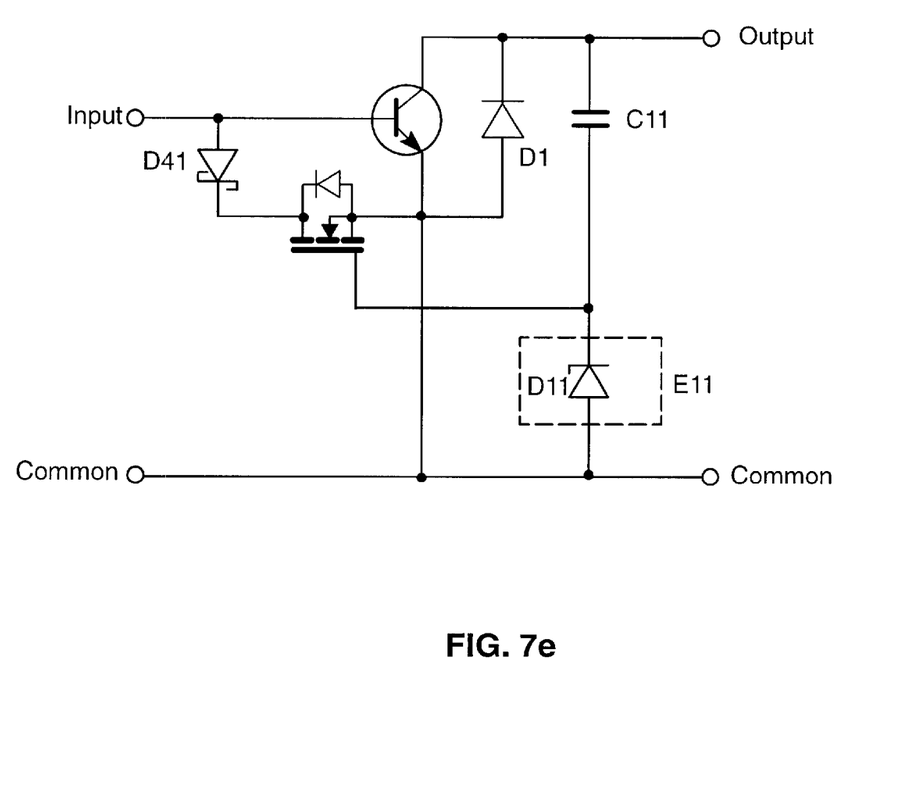
Figure 8A:
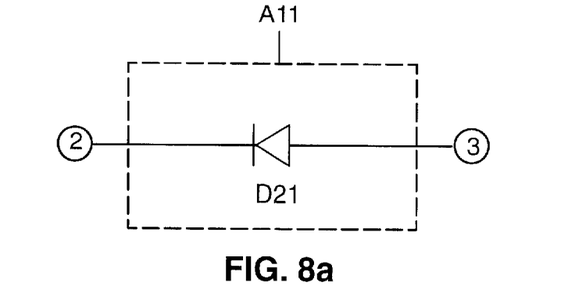
FIGS. 8a to 8d are variations of the antisaturation unit of FIG. 3.
Figure 8B:
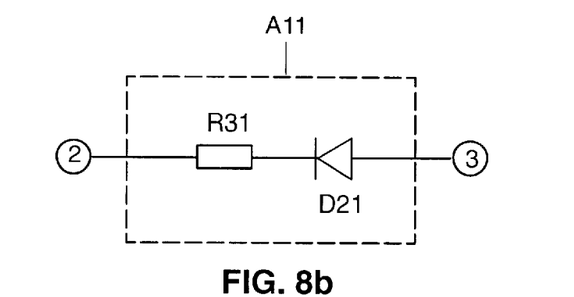
Figure 8C:
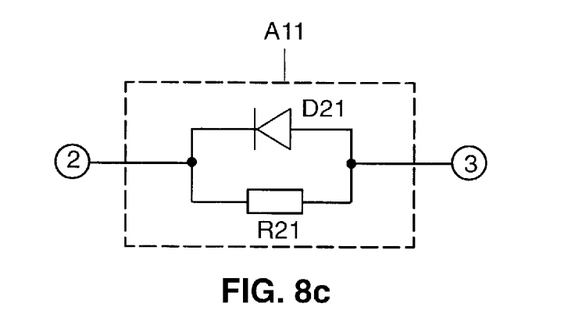
Figure 8D:
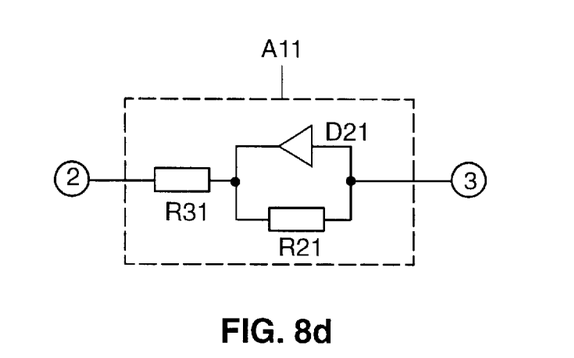

To explain the function of the invention in further detail with reference to FIG. 6, the following variables will be presented: $U_{HBMP}$ designates the voltage at the half bridge center point. Because of the only slight voltage drop at the discharge diode D11, $U_{HBMP}$ is approximately equal to the voltage $U_{C11}$, to which the positive feedback capacitor C11 is charged. A voltage of 230 $V_{DC}$ is applied to the positive pole of the circuit. Because in the exemplary embodiment the highest possible value for $U_{HBMP}$ is 230 V and because of the low impedance of the main switch transistors T1 and T2 that are switched on in alternation, $U_{HBMP}$ is the first guide variable for the discussion below.

The second guide variable is the current $I_{MP}$ through the primary winding of the power transformer LÜ. This variable $I_{MP}$, because of its wide amplitude and because $W=(L/2)*I^2$, has the greatest alternating energy content in the arrangement of FIG. 5. All the other currents in this arrangement, except for $I_{L1}$, are dependent directly or indirectly on $I_{MP}$. The voltages across $C_{K1}$ and $C_{K2}$ add up to 230 V and are established such that $I_{MP}$ is purely an alternating current. If the main switch T1 conducts in the positive direction, then $I_{CT1}=I_{MP}$.

On the assumption that the magnetizing inductance of the trigger transformer STR is inoperative at the switching frequencies involved, the fraction of the main current $I_{MP}$, as defined by the winding ratio of the control transformer STR, is transmitted precisely to its "lower secondary winding" as the current $I_{STR1}$, as long as the main switch T1 is capable of conduction. The direction of winding in the control transformers STR results first in the positive feedback of current and second in the push-pull mode, that is, turning on T1 and T2 in alternation. It follows from this that whenever T2 is to be turned on, the same fraction of $I_{MP}$ as just described is transmitted as $I_{str2}$ to the "upper secondary winding".

The contribution that $I_{str1}$ contributes to triggering T1 is reduced by the applicable value of $I_{L1}$ flowing in the oscillation reversal coil L1. As long as $I_{CT11}=0$, and as long as $U_{HBMP}$ is intermittently constant, the following equation applies:

$$I_{BT1}=I_{str1}-I_{L1}.$$

In the other phases, that is, during the switchover events, that is, while $U_{HBMP}$ is varying over time, the trigger current $I_{BT1}$ for the main switch T1 is reduced by the auxiliary switch collector current $I_{CT11}$ and is raised by the base bridge capacitor current $I_{CBB}$. The equation that applies is then:

$$I_{BT1}=I_{str1}-I_{L1}+I_{CBB}-I_{CT11}.$$

Since the oscillation reversal coil L1 is connected directly parallel to the base-to-emitter path of the main switch T1, the third independent variable $I_{L1}$ is determined solely by the inductance of the oscillation reversal coil L1 and by the main switch control voltage $U_{BT1}$. As long as T1 is triggered, or in other words $U_{BT1}$ is positive, $I_{L1}$ rises in ramplike fashion. As long as T2 is triggered, because of the direction of winding in the triggering transformer STR, the control voltage of the upper main switch is inverse on the lower side; $U_{BT1}$ is negative, and $I_{L1}$ decreases in ramplike fashion. This produces the triangular course of $I_{L1}$.

In contrast to DE 44 36 465 A1, the oscillation reversal coil L1 is connected here directly to ground. The essential function of this component remains unaffected by this.

If $U_{HBMP}$ varies over time, then $U_{C11}$ is changed accordingly. Because of the capacitor C11, the charge current $I_{C11}$ is obtained, which at positive values in the counting direction flows in the form of $I_{BT11}$ through the base of the auxiliary switch T11 and turns it on; at negative values, it flows as $I_{D11}$ through the discharge diode D11.

The voltage of the base of the transistor T11 compared to the reference potential, that is, the trigger voltage for the auxiliary switch T11, is $U_{BT11}$. With reference to FIG. 6, the course over time of the variables thus introduced is as follows:

FIG. 6a first shows the ongoing change in the voltage $U_{HBMP}$ between ground and an applied direct voltage. It should be noted that the edges of the voltage course of $U_{HBMP}$ have a finite rise or fall time that is other than zero.

FIG. 6b shows the current course $I_{MP}$, which fluctuates about the zero point and is sometimes positive and sometimes negative. Because of its coupling in the control transformer STR, the current $I_{str1}$ corresponds to the course of the current $I_{MP}$. The current $I_{L1}$ has a substantially nearly triangular course.

Since $$I_{BT1}=I_{str1}-I_{L1},$$

it follows that $I_{BT1}$ becomes negative as soon as it is true that $I_{L1}>I_{str1}$. At those times, the carriers in the base-emitter diode of the transistor T1 are actively removed, and a fast switch-off event of the transistor T1 is therefore prepared for.

The course of the current $I_{C11}$ through the capacitor C11, shown in FIG. 6c, is composed of positive pulses and negative pulses. The positive pulses occur during the leading edges of the voltage $U_{HBMP}$ and are carried as current $I_{BT11}$ to the base of the auxiliary transistor T11. After a positive pulse of this kind, the positive feedback capacitor C11 is in the charged state. The negative pulses originate in the voltage $U_{HBMP}$ that decreases during the transition of the transistor T1 from the OFF state to the ON state; this voltage is the source of the discharge current that flows through the diode D11 to the capacitor C11. As a result, the capacitor C11 is discharged and is again available for positive feedback during the next turn-on event of the transistor T1.

FIG. 6d shows the course of the voltage $U_{BT11}$, which corresponds to the base-to-emitter voltage at the transistor T11. The positive pulses correspond to the base-to-emitter voltage of the transistor T11 in its ON state, while the negative pulses correspond to the voltage dropping at the diode D11 when this diode is in its conducting state.

What is claimed is:

1. A circuit arrangement, having
    at least one electric main switch (T1; T2) with a reference electrode (E), a control electrode (B), and a work electrode (C),
    a free-wheeling diode (D1; D2), which is connected antiparallel to the main flow direction of each main switch (T1; T2),
    characterized in that
    each main switch (T1; T2) is assigned an electric auxiliary switch (T11; T22), whose work electrode is connected to the control electrode (B) of the associated main switch (T1; T2) and whose reference electrode is connected to the reference electrode (E) of the associated main switch (T1; T2), and at least one capacitor (C11; C22) is disposed between the control electrode of the auxiliary switch (T11; T22) and the work electrode (C) of the associated main switch (T1; T2), and
    a discharge unit (E11; D11; D22) is disposed between the control electrode and the reference electrode of the auxiliary switch in such a way that the at least one capacitor (C11; C22) can be discharged during the transition of the main switch (T1; T2) from the OFF state to the ON state.

2. The circuit arrangement of claim 1, characterized in that the discharge unit (E11) includes a resistor.

3. The circuit arrangement of claim 1, characterized in that a main switch (T1; T2) is a bipolar transistor.

4. The circuit arrangement of claim 1, characterized in that a main switch (T1; T2) together with the associated free-wheeling diode (D1; D2) is realized by a MOSFET.

5. The circuit arrangement of claim 1, characterized in that the discharge unit (E11) has a sense output terminal, which is connected to the control electrode of the auxiliary switch (T11) such that the switching status of the main switch and/or the auxiliary switch can be interrogated via the sense output terminal.

6. The circuit arrangement of claim 5, characterized in that at least one capacitor ($C_{S11}$) is disposed between the sense output terminal and the control electrode of the auxiliary switch (T11).

7. The circuit arrangement of claim 1, characterized in that an auxiliary switch (T11; T22) is a bipolar transistor, a bipolar transistor with a series diode in the collector, a MOSFET, or a MOSFET with a series diode in the drain, and if a series diode is used, its orientation is made such that a current flow in the main flow direction of the associated auxiliary switch (T11; T22) is made possible.

8. The circuit arrangement of claim 7, characterized in that the series diode of the auxiliary switch (T11; T22) is a p-n or Schottky diode.

9. The circuit arrangement of claim 1, characterized in that the discharge unit has a shut-down input terminal (SD), by way of which a signal that switches the auxiliary switch (T11) to the ON state can be applied.

10. The circuit arrangement of claim 9, characterized in that the shut-down input terminal (SD) is connected to the control electrode of the auxiliary switch (T11), and between the shut-down input terminal (SD) and the control electrode of the auxiliary switch (T11), a switch-off diode ($D_{SD}$) is disposed, whose cathode is connected to the terminal of the control electrode of the auxiliary switch.

11. The circuit arrangement of claim 10, characterized in that the switch-off diode ($D_{SD}$) is a p-n or Schottky diode.

12. A bridge circuit having at least one first and one second circuit arrangement (10a, 10b) of claim 1, characterized in that by the first and second circuit arrangements (10a, 10b), a bridge is formed in that the reference electrode of the main switch (T2) of the second circuit arrangement (10b) is connected to the work electrode of the main switch (T1) of the first circuit arrangement (10a).

13. A self-oscillating oscillator circuit for operating a load, having a bridge circuit of claim 12, characterized in that it has a switching control device (STR) for feedback transmission of the load current ($I_{MP}$) to the control electrodes of the main switches (T2, T1) of the first and second circuit arrangements (10b, 10a), and the control electrode of each main switch (T1; T2) is connected by a respective terminal line to the switching control device (STR).

14. The circuit of claim 13, characterized in that the switching control device is a control transformer (STR).

15. The circuit of claim 13, characterized in that the two terminal lines are connected in turn to one another via at least one base bridge capacitor ($C_{BB}$) and that the base bridge capacitor ($C_{BB}$) is connected directly to the control electrode of each main switch (T1; T2) and/or directly to the output of the switching control device (STR) oriented toward the control electrode of the applicable main switch (T1; T2).

16. The circuit arrangement of claim 1, characterized in that the discharge unit (E11) includes a discharge diode (D11; D22).

17. The circuit arrangement of claim 16, characterized in that at least one resistor is connected in series with the discharge diode (D11; D22).

18. The circuit arrangement of claim 16, characterized in that the discharge diode (D11; D22) is a Schottky diode, a Zener diode or a p-n diode.

19. The circuit arrangement of claim 16, characterized in that at least one resistor is connected in parallel with the discharge diode.

20. The circuit arrangement of claim 16, characterized in that at least one resistor is connected in series with the discharge diode and at least one resistor is connected in parallel with the discharge diode.

21. The circuit arrangement of claim 1, characterized in that it also has an antisaturation unit (A11), which is disposed between the work electrode and the control electrode of the auxiliary switch (T11) and which prevents saturation of the control electrode of the auxiliary switch (T11).

22. The circuit arrangement of claim 21, characterized in that the antisaturation unit (A11) has an antisaturation resistor, which is disposed such that in the event of saturation of the control electrode of the auxiliary switch (T11), charge carriers can flow away to the work electrode of the auxiliary switch.

23. The circuit arrangement of claim 21, characterized in that the antisaturation unit (A11) has an antisaturation diode, which is disposed such that in the event of saturation of the control electrode of the auxiliary switch (T11), charge carriers can flow away to the work electrode of the auxiliary switch.

24. The circuit arrangement of claim 23, characterized in that the antisaturation diode is a p-n or Schottky diode.

25. The circuit arrangement of claim 23, characterized in that at least one resistor is connected in series with the antisaturation diode.

26. The circuit arrangement of claim 23, characterized in that at least one resistor is connected in parallel with the antisaturation diode.

27. The circuit arrangement of claim 23, characterized in that at least one resistor is connected in series with the antisaturation diode and at least one resistor is connected in parallel with the antisaturation diode.

* * * * *